United States Patent
Kuo et al.

(10) Patent No.: US 10,283,468 B1
(45) Date of Patent: May 7, 2019

(54) PACKAGE STRUCTURES

(71) Applicant: Taiwan Semiconductor Manufacturing Co., Ltd., Hsinchu (TW)

(72) Inventors: Hsi-Yu Kuo, Hsinchu (TW); Ko-Yi Lee, Hsinchu (TW); Yu-Lin Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/028,420

(22) Filed: Jul. 6, 2018

Related U.S. Application Data

(60) Provisional application No. 62/584,056, filed on Nov. 9, 2017.

(51) Int. Cl.
*H01L 23/538* (2006.01)
*H01L 23/00* (2006.01)

(52) U.S. Cl.
CPC .............. *H01L 24/02* (2013.01); *H01L 24/05* (2013.01); *H01L 24/13* (2013.01); *H01L 2224/0235* (2013.01); *H01L 2224/02331* (2013.01); *H01L 2224/02373* (2013.01); *H01L 2224/02379* (2013.01); *H01L 2224/0401* (2013.01); *H01L 2224/05008* (2013.01); *H01L 2224/05147* (2013.01); *H01L 2224/05155* (2013.01); *H01L 2224/05166* (2013.01); *H01L 2224/13026* (2013.01); *H01L 2224/13111* (2013.01); *H01L 2224/13116* (2013.01); *H01L 2224/13139* (2013.01); *H01L 2224/13147* (2013.01)

(58) Field of Classification Search
CPC ... H01L 23/52; H01L 23/522; H01L 23/5221; H01L 23/528; H01L 23/5283; H01L 23/5286; H01L 23/5386; H01L 24/02; H01L 24/05; H01L 24/10; H01L 24/13
See application file for complete search history.

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

*Primary Examiner* — Cuong Q Nguyen
(74) *Attorney, Agent, or Firm* — JCIPRNET

(57) ABSTRACT

A package structure includes at least one semiconductor chip, an insulating encapsulation, and a redistribution circuit structure. The semiconductor chip has an active surface and connecting pads distributed thereon. The insulating encapsulation encapsulates the semiconductor chip. The redistribution circuit structure is disposed on and has at least one metallization layer with metal segments, wherein the redistribution circuit structure is electrically connected to the semiconductor chip through the at least one metallization layer and the connecting pads electrically connected thereto. A projection location of a first gap between any two most adjacent connecting pads of the connecting pads is partially overlapped with a projection location of a second gap between any two most adjacent metal segments of the metal segments of the at least one metallization layer in a vertical projection on the active surface of the at least one semiconductor chip.

20 Claims, 13 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2015/0179591 A1* | 6/2015 | Tsai .................... H01L 23/5386 257/774 |
| 2019/0006283 A1* | 1/2019 | Wang ...................... H01L 24/19 |
| 2019/0013276 A1* | 1/2019 | Lee ..................... H01L 23/5386 |

* cited by examiner

PACKAGE STRUCTURES

CROSS-REFERENCE TO RELATED APPLICATION

This application claims the priority benefits of U.S. provisional application Ser. No. 62/584,056, filed on Nov. 9, 2017. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a signal semiconductor wafer. The semiconductor chips of the wafer may be processed and packaged with other semiconductor devices, semiconductor chips, semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
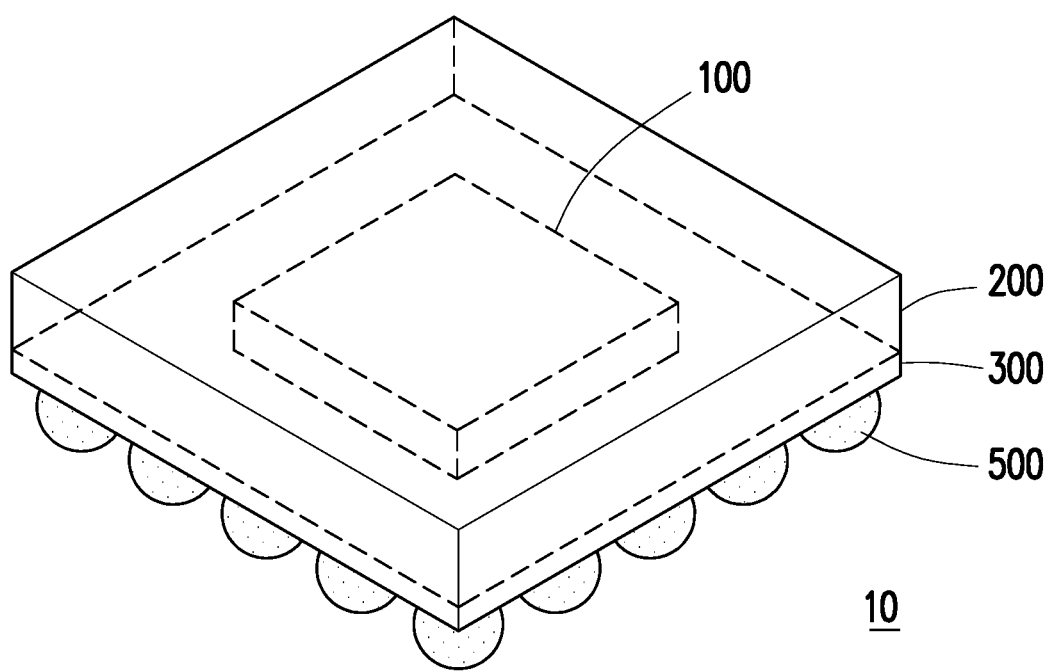
FIG. 1 is schematic three-dimensional side-view diagram of a package structure in accordance with some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
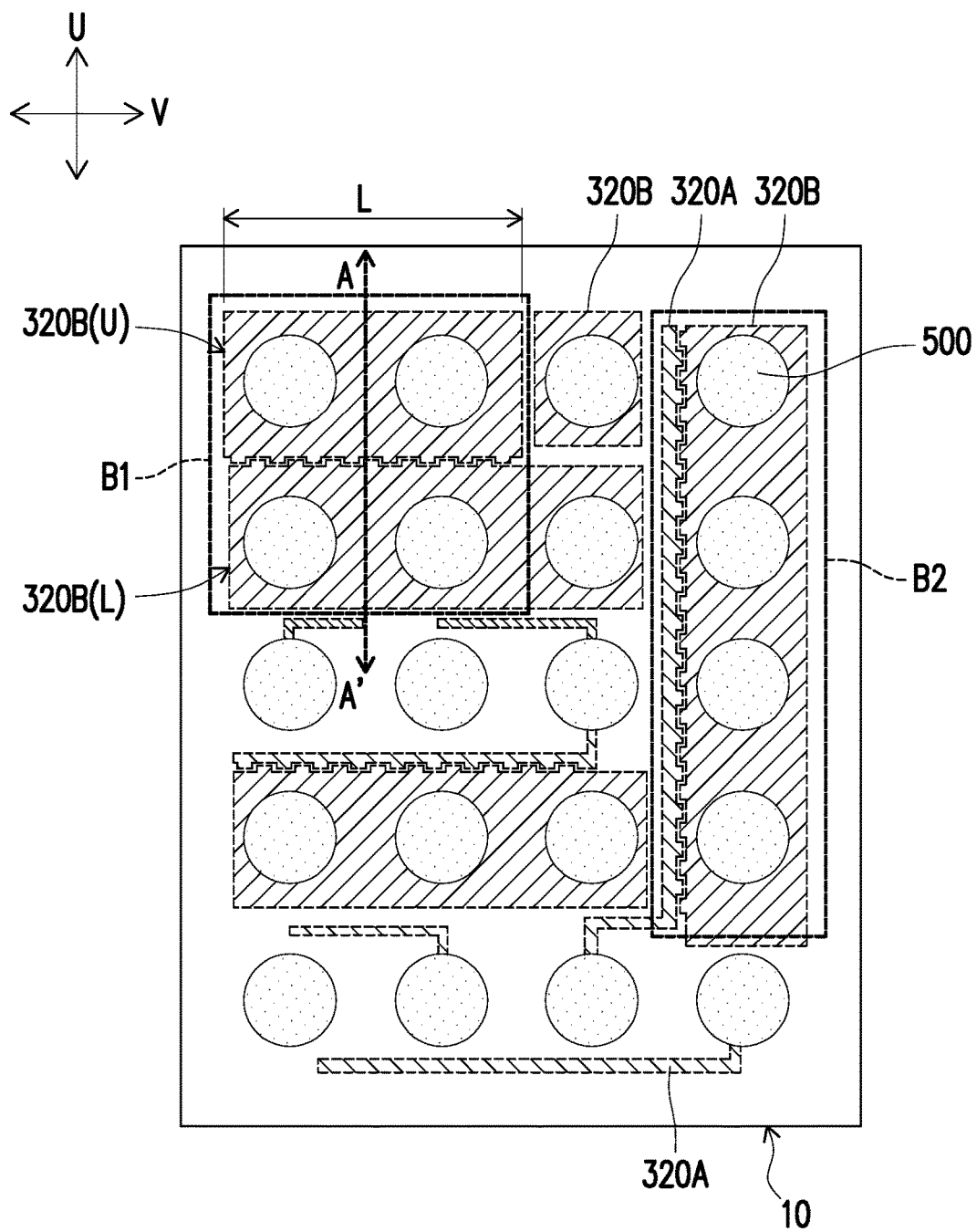
FIG. 2A is a schematic bottom view of a portion of the package structure in accordance with some embodiments of the present disclosure.
Figure 2B:
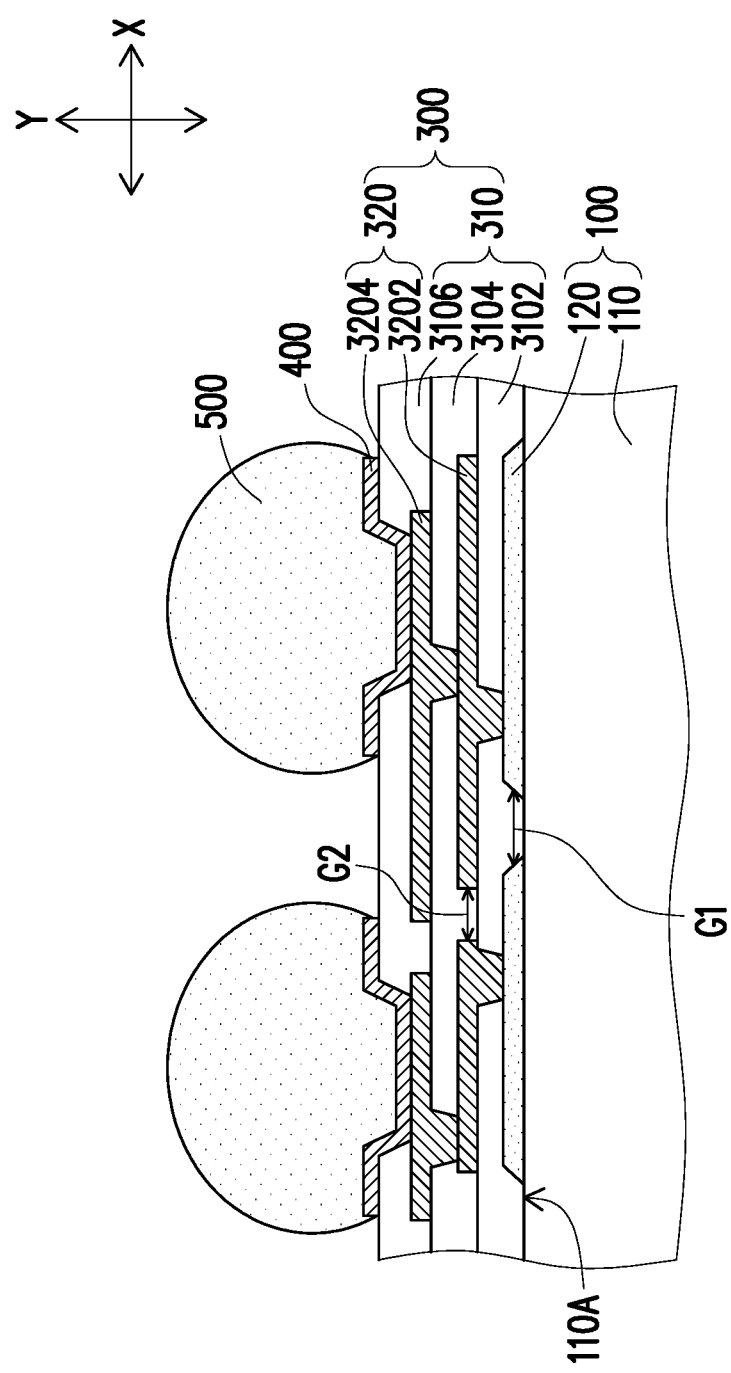
FIG. 2B is a schematic cross-sectional view of a portion of the package structure of FIG. 2A along the cross-sectional line A-A' in accordance with some embodiments of the present disclosure.
Figure 3A:
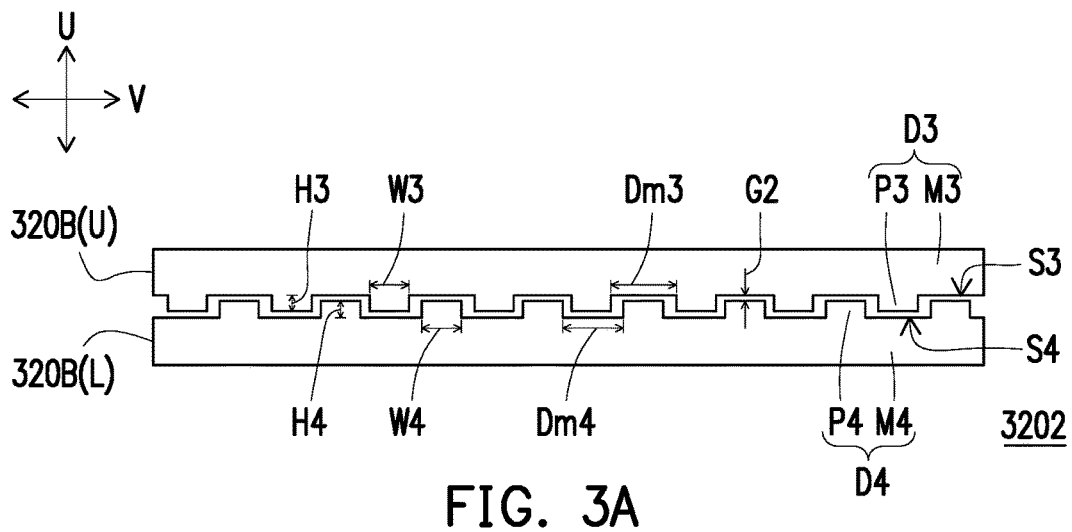
FIG. 3A is a schematic enlarged top view illustrating a metallization layer of a redistribution circuit structure of the package structure of FIG. 2A indicating by a dotted box B1 in accordance with some exemplary embodiments of the present disclosure.
Figure 3B:
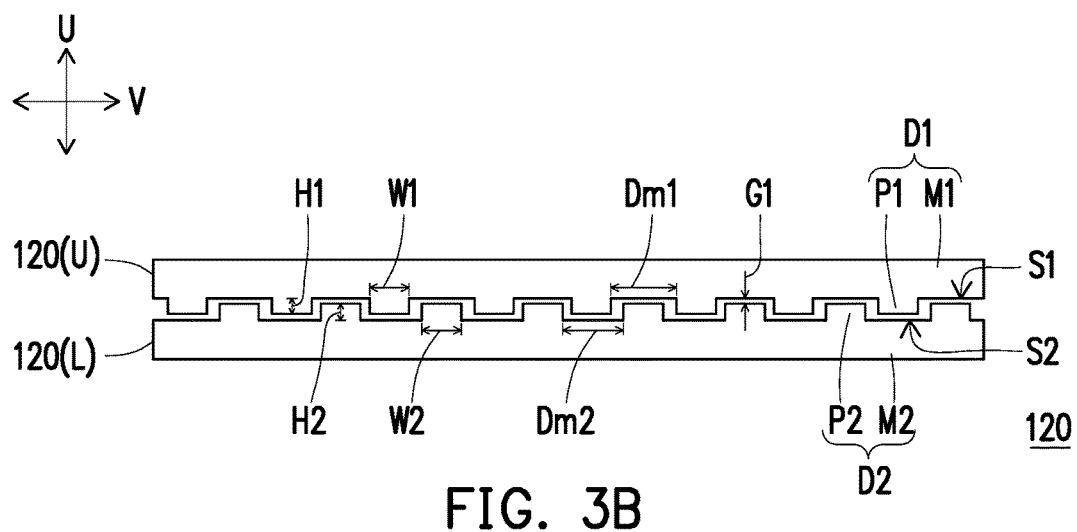
FIG. 3B is a schematic enlarged top view illustrating connecting pads of a semiconductor chip of the package structure of FIG. 2A indicating by a dotted box B1 in accordance with some exemplary embodiments of the present disclosure.
Figure 3C:
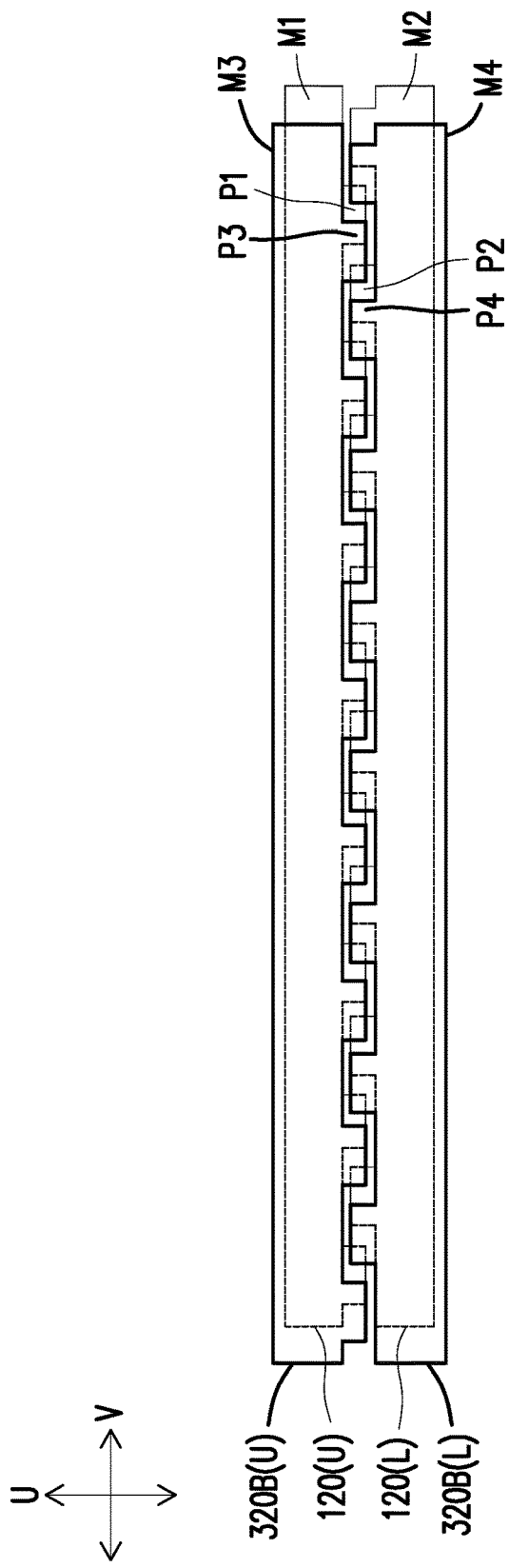
FIG. 3C is a schematic enlarged top views respectively illustrating relative positioning configurations between the metallization layer depicted in FIG. 3A and the connecting pads depicted in FIG. 3B in accordance with some exemplary embodiments of the present disclosure.

FIG. 1 is schematic three-dimensional side-view diagram of a package structure in accordance with some exemplary embodiments of the present disclosure. FIG. 2A is a schematic bottom view of a portion of the package structure in accordance with some embodiments of the present disclosure. FIG. 3A is a schematic enlarged top view illustrating a metallization layer of a redistribution circuit structure of the package structure of FIG. 2A indicating by the dotted box B1 in accordance with some exemplary embodiments of the present disclosure. FIG. 3B is a schematic enlarged top view illustrating connecting pads of a semiconductor chip of the package structure of FIG. 2A indicating by the dotted box B1 in accordance with some exemplary embodiments of the present disclosure. FIG. 3C is a schematic enlarged top view illustrating a relative positioning configuration between the metallization layer depicted in FIG. 3A and the connecting pads depicted in FIG. 3B in accordance with some exemplary embodiments of the present disclosure. FIG. 2B is a schematic cross-sectional view of a portion of the package structure of FIG. 2A along the cross-sectional line A-A' in accordance with some embodiments of the present disclosure.

Referring to FIG. 1 and FIG. 2B, in some embodiments, a package structure 10 includes at least one semiconductor chip 100, an insulating encapsulation 200, a redistribution circuit structure 130, and a plurality of conductive elements 500. In some embodiments, the semiconductor chip 100 is covered by the insulating encapsulation 200. The disclosure is not limited thereto, in an alternative embodiment, the semiconductor chip 100 is embedded in the insulating encapsulation 200. In one embodiment, the material of the insulating encapsulation 200 includes epoxy resins, phenolic resins or silicon-containing resins, or any suitable materials, for example. In an alternative embodiment, the insulating encapsulation 200 may include any insulating encapsulation material that is able to be patterned by suitable patterning processes. In some embodiments, the insulating encapsulation 200 may further include inorganic filler or inorganic compound (e.g. silica, clay, and so on) which can be added therein to optimize coefficient of thermal expansion (CTE) of the insulating encapsulation 200. The disclosure is not limited thereto.

In some embodiments, the semiconductor chip 100 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The number of the semiconductor chip 100 is not limited according to the disclosure. In an alternative embodiment, the number of the semiconductor chip 100 is more than one, and the types of the semiconductor chip 100 may be different from one another or the same, the disclosure is not limited thereto.

In some embodiments, the semiconductor chip 100 includes a semiconductor substrate 110 and a plurality of connecting pads 120, as shown in FIG. 2B. In certain embodiments, the semiconductor substrate 100 includes an active surface 110A, where the connecting pads 120 are distributed thereon. For example, the semiconductor chip 110 may be a silicon substrate including active components (e.g., transistors or the like) and/or passive components (e.g., resistors, capacitors, inductors or the like) formed therein.

In one embodiment, the connecting pads 120 are aluminum pads, copper pads, or other suitable metal pads, where the connecting pads 120 are electrically connected to the active components and/or the passive components included in the semiconductor substrate 110. The number of the connecting pads 120 is not limited according to the disclosure. In certain embodiments, the connecting pads 120 are grouped into different groups for different types of electrical connection of the semiconductor chip 100. For example, a group of the connecting pads 120 may be used for signal transmitting between the semiconductor chip 100 and other electronic components (active components and/or passive components) inside or outside of the package structure 10, another group of the connecting pads 120 may be used to electrically connect the package structure 10 to a power source, and another group of the connecting pads may be used to electrically ground the package structure 10; the disclosure is not limited thereto. In other words, the semiconductor chip 100 is at least partially encapsulated in the insulating encapsulation 200, where a portion (such as the connecting pads 120) of the semiconductor chip 100 is exposed by the insulating encapsulation 200.

In an alternative embodiment, the semiconductor chip 100 may further include interconnection circuit structure including one or more inter-dielectric layers and one or more patterned conductive layers stacked alternately, where the interconnection circuit structure is disposed on the active surface 110A of the semiconductor substrate 100 and is electrically connected to the active components and/or the passive components included in the semiconductor substrate 110. In one embodiment, the numbers of the inter-dielectric layers and the patterned conductive layers can be selected based on demand and are not limited in the disclosure.

In the embodiment which the semiconductor chip 100 further includes the interconnection circuit structure and the connecting pads 120 are the aluminum pads, the interconnection circuit structure is located between the semiconductor substrate 110 and the connecting pads 120, where the connecting pads 120 are mechanically and electrically connected to a topmost layer of patterned conductive layers exposed by a topmost layer of the inter-dielectric layers for electrically connecting to the active components and/or the passive components included in the semiconductor substrate 110. In the embodiment which the semiconductor chip 100 further includes the interconnection circuit structure and the connecting pads 120 are the copper pads, the interconnection circuit structure disposes on the active surface 110A of the semiconductor substrate 100, and the connecting pads 120 are a topmost layer of patterned conductive layers exposed by a topmost layer of the inter-dielectric layers.

As shown in FIG. 1 and FIG. 2B, in some embodiments, the redistribution circuit structure 300 are disposed on and electrically connected to the semiconductor chip 100. In some embodiments, the redistribution circuit structure 300 is referred as a front-side redistribution structure layer providing routing function for the semiconductor chip 100. In certain embodiments, the redistribution circuit structure 300 is fabricated to electrically connect with one or more connectors underneath. Here, the afore-said connectors may be the connecting pads 120 of the semiconductor chip 100. In other words, the redistribution circuit structure 300 is electrically connected to the connecting pads 120 of the semiconductor chip 100. In one embodiment, the redistribution circuit structure 300 is electrically connected to the connecting pads 120 of the semiconductor chip 100 by mechanically connection as shown in FIG. 2B, however the disclosure is not limited thereto. In an alternative embodiment, the redistribution circuit structure 300 is electrically connected to the connecting pads 120 of the semiconductor chip 100 through connecting vias (not marked) disposed therebetween, where the connecting vias may include copper vias, copper alloy vias, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the redistribution circuit structure 300 includes a plurality of inter-dielectric layers 310 and a plurality of metallization layers 320 stacked alternately. For example, the inter-dielectric layers 310 include the first inter-dielectric layer 3102, the second inter-dielectric layer 3104, and the third inter-dielectric layer 3106, and the metallization layers 320 includes the first metallization layer 3202 and the second metallization layer 3204. As seen in FIG. 2B, the redistribution circuit structure 300 includes a first inter-dielectric layer 3102, a first metallization layer 3202, a second inter-dielectric layer 3104, a second metallization layer 3204, and a third inter-dielectric layer 3106, where the first metallization layer 3202 is sandwiched between the first inter-dielectric layer 3102 and the second inter-dielectric layer 3104, and the second metallization layer 3204 is sandwiched between the second inter-dielectric layer 3104 and the third inter-dielectric layer 3106. In certain embodiments, a top surface of the second metallization layer 3204 is exposed by the third inter-dielectric layer 3106, and a bottom surface of the first metallization layer 3202 is exposed by the first inter-dielectric layer 3102.

As shown in FIG. 2B, in some embodiments, top surfaces of the connecting pads 120 are in contact with the first metallization layer 3202 of the metallization layers 320. In other words, for example, the top surfaces of the connecting pads 120 are partially covered by the first inter-dielectric layer 3102 of the inter-dielectric layers 310. In some embodiments, the exposed bottom surface of the first metallization layer 3202 is connected to the connecting pads 120 of the semiconductor chip 100 so as to electrically connect the semiconductor chip 100 to the redistribution circuit structure 300, and the exposed top surface of the second metallization layer 3204 is connected to the conductive elements 500 (e.g., conductive balls, such as solder balls). As shown in FIG. 1 and FIG. 2B, the redistribution circuit structure 300 is located between the semiconductor chip 100 and the conductive elements 500 and between the insulating encapsulation 200 and the conductive elements 500, where the redistribution circuit structure 300 is electrically connected to the semiconductor chip 100 through the connecting pads 120 and the metallization layers 320.

In one embodiment, the inter-dielectric layers 310 (e.g. the first inter-dielectric layers 3102, the second inter-dielectric layers 3104 and the third inter-dielectric layers 3106) may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the inter-dielectric layers 310 may be formed by suitable fabrication techniques such as spin-on coating, chemical vapor deposition (CVD), plasma-enhanced chemical vapor deposition (PECVD) or the like.

In one embodiment, the metallization layers 320 (e.g. the first metallization layer 3202 and the second metallization layer 3204) may be made of conductive materials formed by electroplating or deposition, such as copper, copper alloy, aluminum, aluminum alloy, or combinations thereof, which may be patterned using a photolithography and etching process. In some embodiments, the metallization layers 320 may be patterned copper layers or other suitable patterned metal layers. It should be noted that the redistribution circuit structure 300 is not limited to include three inter-dielectric layers and/or two metallization layers, i.e., the number of inter-dielectric layer(s) and/or metallization layer(s) is not limited to what is disclosed herein according to the present disclosure.

In certain embodiments, the first metallization layer 3202 and the second metallization layer 3204 of the metallization layers 320, which are respectively referred as a bottommost layer and a topmost layer of the metallization layer 320, may individually include a plurality of metal segments 320A, 320B (see FIG. 2A). In certain embodiments, the metal segments 320A, 320B included in each of the first metallization layer 3202 and the second metallization layer 3204 of the metallization layers 320 are grouped into different groups which corresponding to the groups of the connecting pads 120 for different purposes as described above. For example, the group of the metal segments 320A is corresponding to the group of the connecting pads 120 for signal transmit between the semiconductor chip 100 and the active components (and/or passive components), and the group of the metal segments 320B is corresponding to the group of the connecting pads 120 for an electrical connection between the semiconductor chip 100 and an external component being electrically grounded or providing an electric power.

In some embodiments, as shown in FIG. 1 and FIG. 2B, the conductive elements 500 may be disposed on the second metallization layer 3204 of the metallization layers 320 by ball placement process or reflow process. In some embodiments, the conductive elements 500 may be, solder balls or ball grid array (BGA) balls, chip connectors ("C4") or other connectors for connecting to an external device. In some embodiments, the material of the conductive elements 500 may include lead-based materials (such as Sn—Pb base materials) or lead-free material (such as Sn—Ag base or Sn—Ag—Cu base materials) with or without additional impurity (such as Ni, Bi, Sb, Au, etc). The disclosure is not limited thereto.

In some embodiments, as shown in FIG. 2B, the package structure 10 further includes a plurality of under-bump metallurgy (UBM) patterns 400. In certain embodiments, the under-bump metallurgy patterns 400 are formed on the exposed top surface of the metallization layers 320 of the redistribution circuit structure 300 for electrically connecting with the conductive elements 500 and/or additional semiconductor elements (not shown), respectively. As shown in FIG. 2B, for example, the under-bump metallurgy patterns 400 are located between the second metallization layer 3204 of the metallization layers 320 of the redistribution circuit structure 300 and the conductive elements 500; however, the disclosure is not limited thereto.

Due to the under-bump metallurgy patterns 400 are formed on the exposed top surface of the second metallization layer 3204 of the metallization layers 320 of the redistribution circuit structure 300, the later-formed conductive elements 500 and/or the additional semiconductor elements can be accurately located on the under-bump metallurgy patterns 500 with better fixation, and the ball drop yield and reliability of the package structure 10 are improved. In some embodiments, the under-bump metallurgy patterns 500 may include copper, nickel, titanium, a combination thereof or the like, and are formed by an electroplating process. The number of the under-bump metallurgy patterns 400 is not specifically limited in the present disclosure; and it may be determined or selected based on the demand.

Referring to FIG. 2A, FIG. 3A, and FIG. 3B, in some embodiments, FIG. 2A demonstrates the configuration of the metal segments 320A and the metal segments 320B included in the first metallization layer 3202 in relative to the conductive balls 500, FIG. 3A shows the configuration of the metal segments 320A and the metal segments 320B included in the first metallization layer 3202 in the dotted box B1 depicted in FIG. 2A, and FIG. 3B shows the configuration of the connecting pads 120 electrically coupled to the metal segments 320A and the metal segments 320B depicted in FIG. 3A. In some embodiments, the metal segments 320A, the overlying conductive balls 500 and the underlying connecting pads 120 are together used for signal transmit, and the metal segments 320B, the overlying conductive balls 500 and the underlying connecting pads 120 are together used are for electrically ground or an electric power connection. In some embodiments, any two most adjacent metal segments of the metal segments 320A and the metal segments 320B (such as one metal segment 320A and one metal segment 320B. two metal segments 320A, or two metal segments 320B), which are extended along one direction and substantially parallel to each other with a length L greater than or substantially equal to 200 μm, the edges of the two most adjacent metal segments being substantially parallel to and facing toward each other have non-planar edges with complementary shapes (see FIG. 2A and FIG. 3A). In some embodiments, (a portion or all of) the connecting pads 120 respectively have the same or similar configurations (e.g., the non-planar edges with complementary shapes and the dimension thereof, see FIG. 3B) as the metal segments 320A and the metal segments 320B included in the first metallization layer 3202 overlying thereto, and thus the connecting pads 120 are substantially covered by the metal segments 320A and the metal segments 320B included in the first metallization layer 3202 and are not be seen from FIG. 2A. However, the disclosure is not limited thereto. In an alternative embodiment, the connecting pads 120 may be slightly different or completely different configuration as comparing with the metal segments 320A and the metal segments 320B included in the first metallization layer 3202 overlying thereto.

As shown in FIG. 2A, in one embodiment, in the dotted box B1 of FIG. 2A, two most adjacent metal segments, which are two metal segments 320B, extend along a direction V and are parallel to one another with at least the length L (greater than or substantially equal to 200 μm), where the edges of the two most adjacent metal segments 320B facing toward each other have the non-planar edges with complementary shapes which would be discussed in detail in the following description. In an alternative embodiment, in the dotted box B2 depicted in FIG. 2A, two most adjacent metal segments, which are one metal segment 320A and one metal segment 320B, extend along a direction U and are parallel to one another with at least the length L (greater than or substantially equal to 200 μm), where the edges of the most adjacent metal segment 320A and metal segment 320B facing toward each other have the non-planar edges with complementary shapes. In a further alternative embodiment, the two most adjacent metal segments may be two metal segments 320A, the disclosure is not limited thereto.

Back to FIG. 2A and FIG. 3A, for simplicity and illustrating purpose, the two most adjacent metal segments 320B indicated in the dotted box B1 are referred as the metal segment 320B(U) and metal segment 320B(L) respectively, and the disclosure is not limited thereto. In some embodiments, the metal segment 320B(U) is considered as a division D3 having a main portion M3 and a plurality of protrusions P3 connected to a side S3 of the main portion M3, and the metal segment 320B(L) is considered as a division D4 having a main portion M4 and a plurality of protrusions P4 connected to a side S4 of the main portion M4, where the side S3 of the main portion M3 faces toward the side S4 of the main portion M4. In other words, the protrusions P3 of the metal segment 320B(U) protrude from the side S3 of the metal segment 320B(U) toward the side S4 of the metal segment 320B(L), the protrusions P4 of the metal segment 320B(L) protrude from the side S4 of the metal segment 320B(L) toward the side S3 of the metal segment 320B(U), and the protrusions P3 of the metal segment 320B(U) and the protrusions P4 of the metal segment 320B(L) are located between the main portion M3 of the metal segment 320B(U) and the main portion M4 of the metal segment 320B(L) and arranged alternately with spaces. As shown in FIG. 3A, the protrusions P3 of the metal segment 320B(U) and the protrusions P4 of the metal segment 320B(L) are arranged in stagger manner and are not overlapped with one another, for example.

As shown in FIG. 3A, in some embodiments, the protrusions P3 are separated from each other by a minimum distance Dm3, and the minimum distance Dm3 is ranging from about 1 μm to about 50 μm. In some embodiments, the protrusions P4 are separated from each other by a minimum distance Dm4, and the minimum distance Dm4 is ranging from about 1 μm to about 50 μm. As show in FIG. 3A, the metal segment 320B(U) is separated from the metal segment 320B(L) by a gap G2, where a range of the gap G2 is approximately from 0.5 μm to 20 μm. In one embodiment, the gap G2 sandwiched between the metal segment 320B(U) and the metal segment 320B(L) is substantially constant and is formed in a meander-shape manner from the top view of FIG. 3A. In an alternative embodiment, the gap G2 sandwiched between the metal segment 320B(U) and the metal segment 320B(L) is non-constant and is formed in a meander-shape manner from the top view.

Figure 4A:
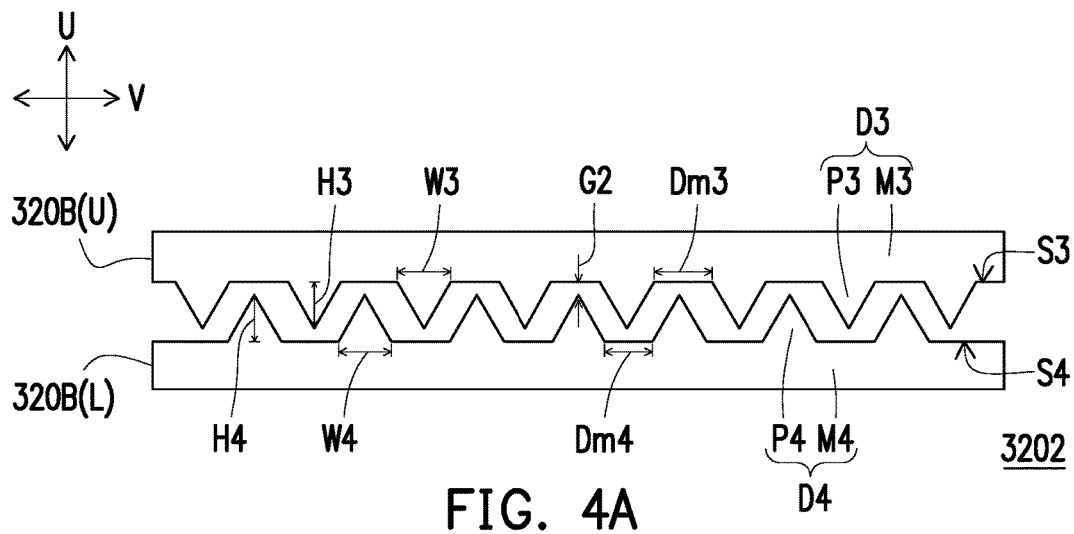
FIG. 4A is a schematic enlarged top view illustrating a metallization layer of a redistribution circuit structure of the package structure of FIG. 2A indicating by a dotted box B1 in accordance with some exemplary embodiments of the present disclosure.
Figure 5A:
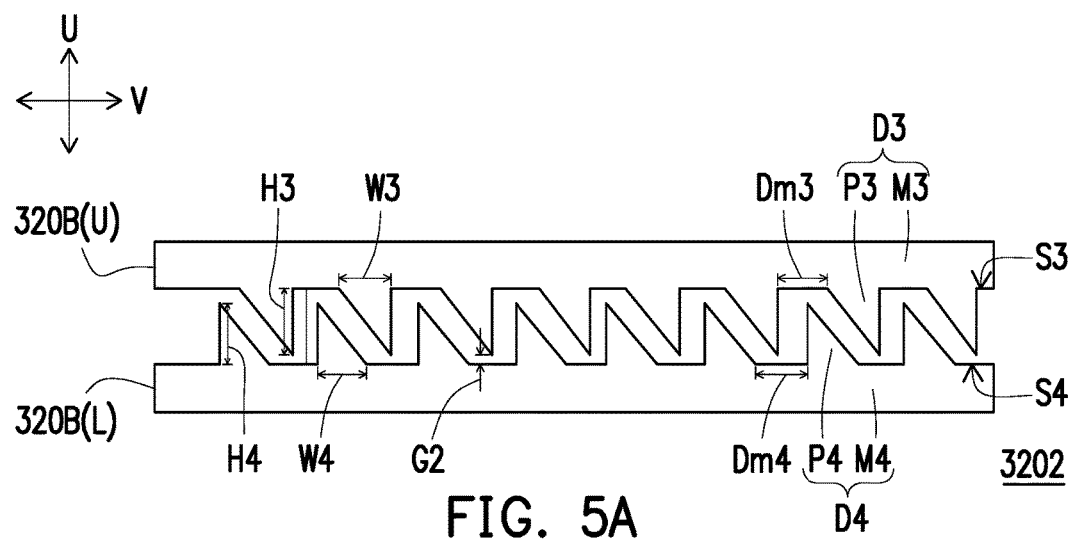
FIG. 5A is a schematic enlarged top view illustrating a metallization layer of a redistribution circuit structure of the package structure of FIG. 2A indicating by a dotted box B1 in accordance with some exemplary embodiments of the present disclosure.
Figure 6A:
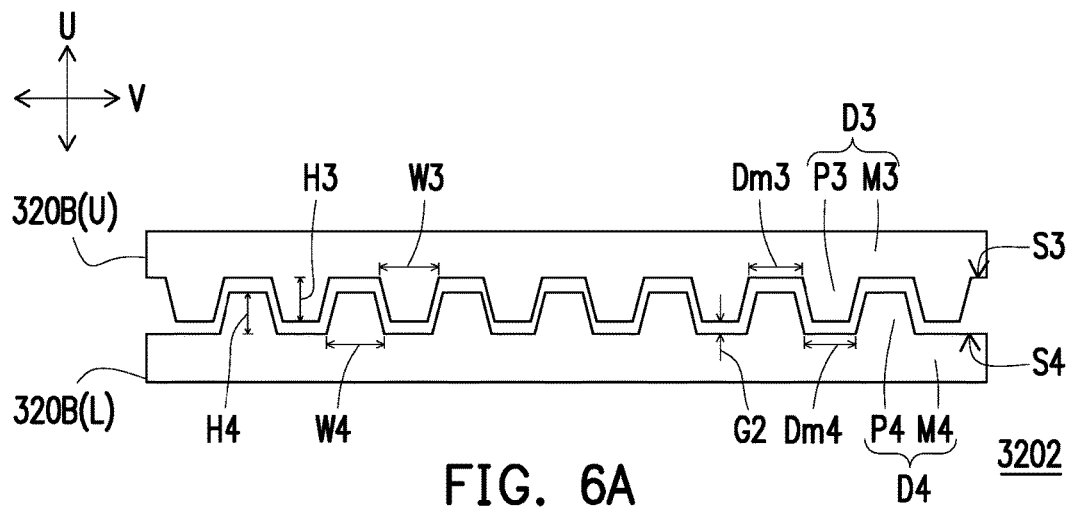
FIG. 6A is a schematic enlarged top view illustrating a metallization layer of a redistribution circuit structure of the package structure of FIG. 2A indicating by a dotted box B1 in accordance with some exemplary embodiments of the present disclosure.
Figure 7A:
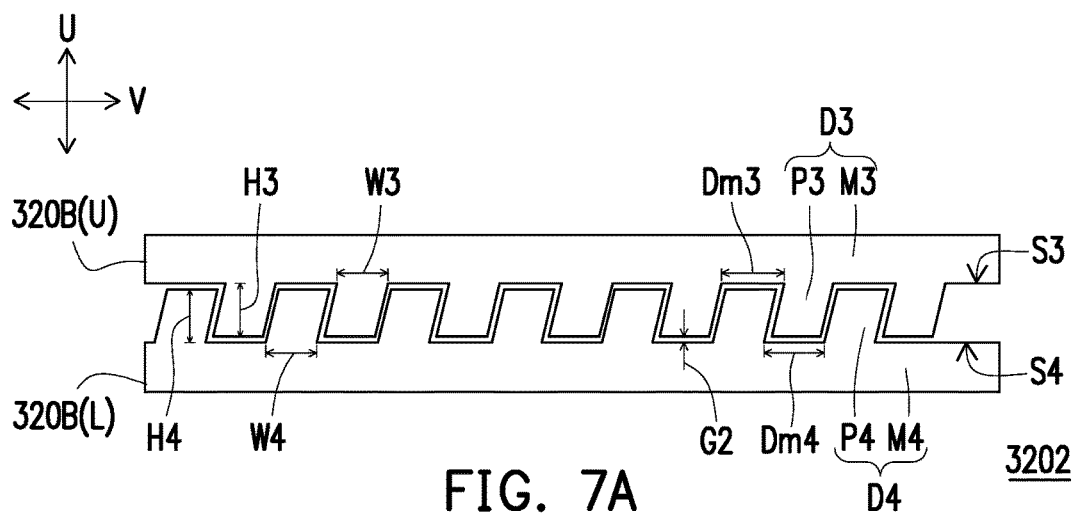
FIG. 7A is a schematic enlarged top view illustrating a metallization layer of a redistribution circuit structure of the package structure of FIG. 2A indicating by a dotted box B1 in accordance with some exemplary embodiments of the present disclosure.

In certain embodiments, the shapes of the protrusions P3 and the protrusions P4 include a rectangle shape (FIG. 3A) or a square shape, where each of the protrusions P3 has a maximum size H3 measured along the direction U and a maximum size W3 measured along the direction V, and each of the protrusions P4 has a maximum size H4 measured along the direction U and a maximum size W4 measured along the direction V. In certain embodiments, for the protrusions P3, the maximum size H3 is ranging from about 0.5 µm to about 20 µM, and the maximum size W3 is ranging from about 1 µm to about 50 µm. In certain embodiments, for the protrusions P4, the maximum size H4 is ranging from about 0.5 µm to about 20 µm, and the maximum size W4 is ranging from about 1 µm to about 50 µm. In one embodiment, the maximum size H3 and the maximum size H4 may be the same. In an alternative embodiment, the maximum size H3 may be different from the maximum size H4. In one embodiment, the maximum size W3 and the maximum size W4 may be the same. In an alternative embodiment, the maximum size W3 may be different from the maximum size W4. The disclosure is not limited thereto. In alternative embodiments, with the above sizing specifications, the shapes of protrusions P3 and the protrusions P4 may include a triangle shape (FIG. 4A), a right triangle shape (FIG. 5A), a right trapezoid shape (FIG. 6A), a parallelogram shape (FIG. 7A), or combinations thereof, the disclosure is not limited thereto. Due to the protrusions P3 and the protrusion P4, the stress applied to the inter-layer dielectric layers 310 located between the two most adjacent the metal segments (for example, the metal segments 320B(U) and 320B (L)) is reduced, thereby achieving the durability of the package structure 10.

Back to FIG. 3B, for simplicity and illustrating purpose, the connecting pads 120 electrically couple to and underlying the metal segment 320B(U) and metal segment 320B(L) are respectively referred as the connecting pad 120(U) and the connecting pad 120(L), however the disclosure is not limited thereto. In some embodiments, the connecting pad 120(U) is considered as a division D1 having a main portion M1 and a plurality of protrusions P1 connected to a side S1 of the main portion M1, and the connecting pad 120(L) is considered as a division D2 having a main portion M2 and a plurality of protrusions P2 connected to a side S2 of the main portion M2, where the side S1 of the main portion M1 faces toward the side S2 of the main portion M2. In other words, the protrusions P1 of the connecting pad 120(U) protrude from the side S1 of the connecting pad 120(U) toward the side S2 of the connecting pad 120(L), the protrusions P2 of the connecting pad 120(L) protrude from the side S2 of the connecting pad 120(L) toward the side S1 of the connecting pad 120(U), and the protrusions P1 of the connecting pad 120(U) and the protrusions P2 of the connecting pad 120 (L) are located between the main portion M1 of the connecting pad 120(U) and the main portion M2 of the connecting pad 120(L) and arranged alternately.

As shown in FIG. 3B, in some embodiments, the protrusions P1 are separated from each other by a minimum distance Dm1, and the minimum distance Dm1 is ranging from about 1 µm to about 50 µm. In some embodiments, the protrusions P2 are separated from each other by a minimum distance Dm2, and the minimum distance Dm2 is ranging from about 1 µm to about 50 µm. As show in FIG. 3B, the connecting pad 120(U) is separated from the connecting pad 120(L) by a gap GI, where a range of the gap G1 is approximately from 0.5 µm to 20 µm. In one embodiment, the gap G1 sandwiched between the connecting pad 120(U) and the connecting pad 120(L) is substantially constant and is formed in a meander-shape manner from the top view of FIG. 3B. In an alternative embodiment, the gap G1 sandwiched between the connecting pad 120(U) and the connecting pad 120(L) is non-constant and is formed in a meander-shaped manner from the top view. As shown in FIG. 3B, the protrusions P1 of the connecting pad 120(U) and the protrusions P2 of the connecting pad 120(L) are arranged in stagger manner and are not overlapped with one another, for example.

Figure 4B:
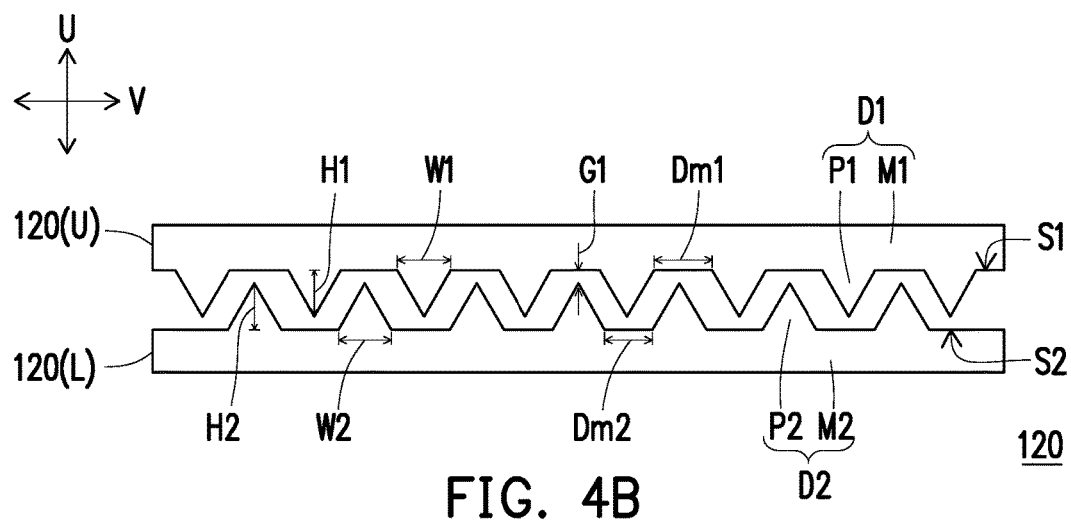
FIG. 4B is a schematic enlarged top view illustrating connecting pads of a semiconductor chip of the package structure of FIG. 2A indicating by a dotted box B1 in accordance with some exemplary embodiments of the present disclosure.
Figure 4C:
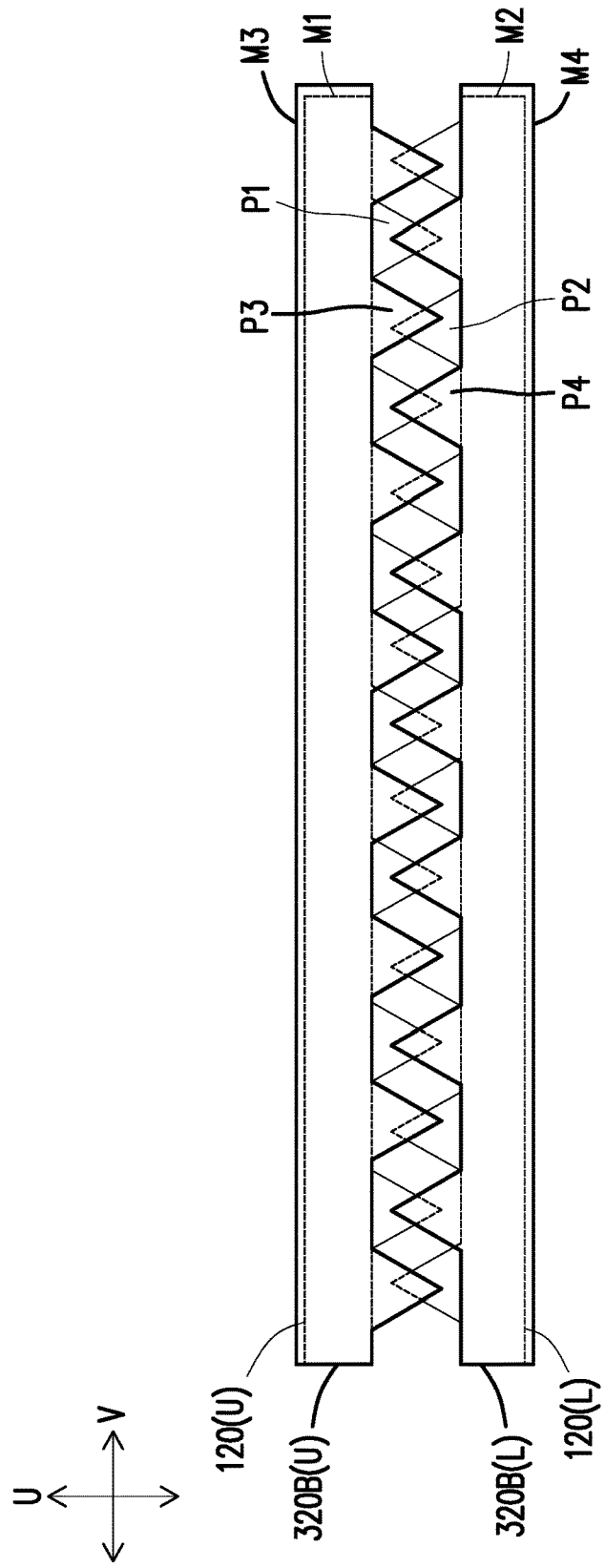
FIG. 4C is a schematic enlarged top views respectively illustrating relative positioning configurations between the metallization layer depicted in FIG. 4A and the connecting pads depicted in FIG. 4B in accordance with some exemplary embodiments of the present disclosure.
Figure 5B:
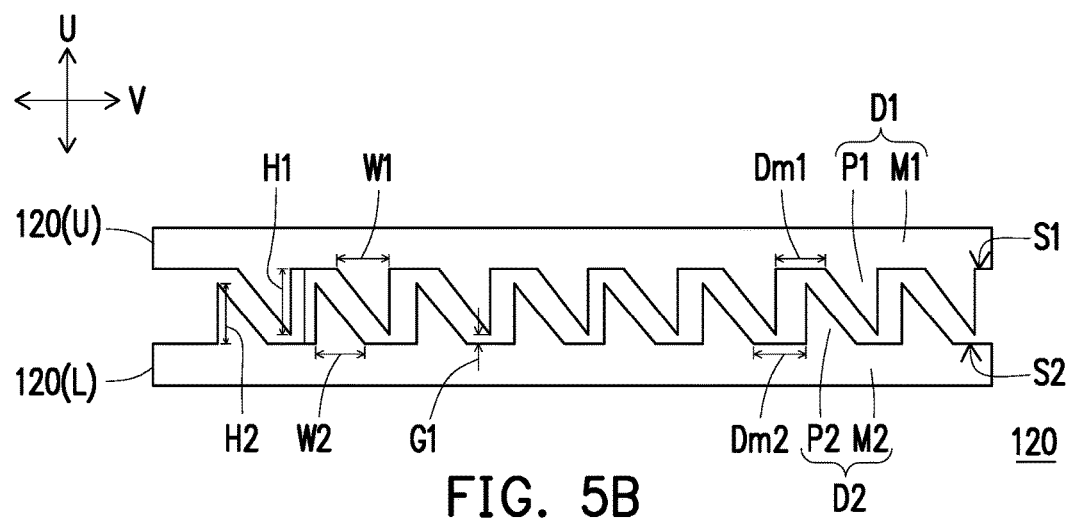
FIG. 5B is a schematic enlarged top view illustrating connecting pads of a semiconductor chip of the package structure of FIG. 2A indicating by a dotted box B1 in accordance with some exemplary embodiments of the present disclosure.
Figure 5C:
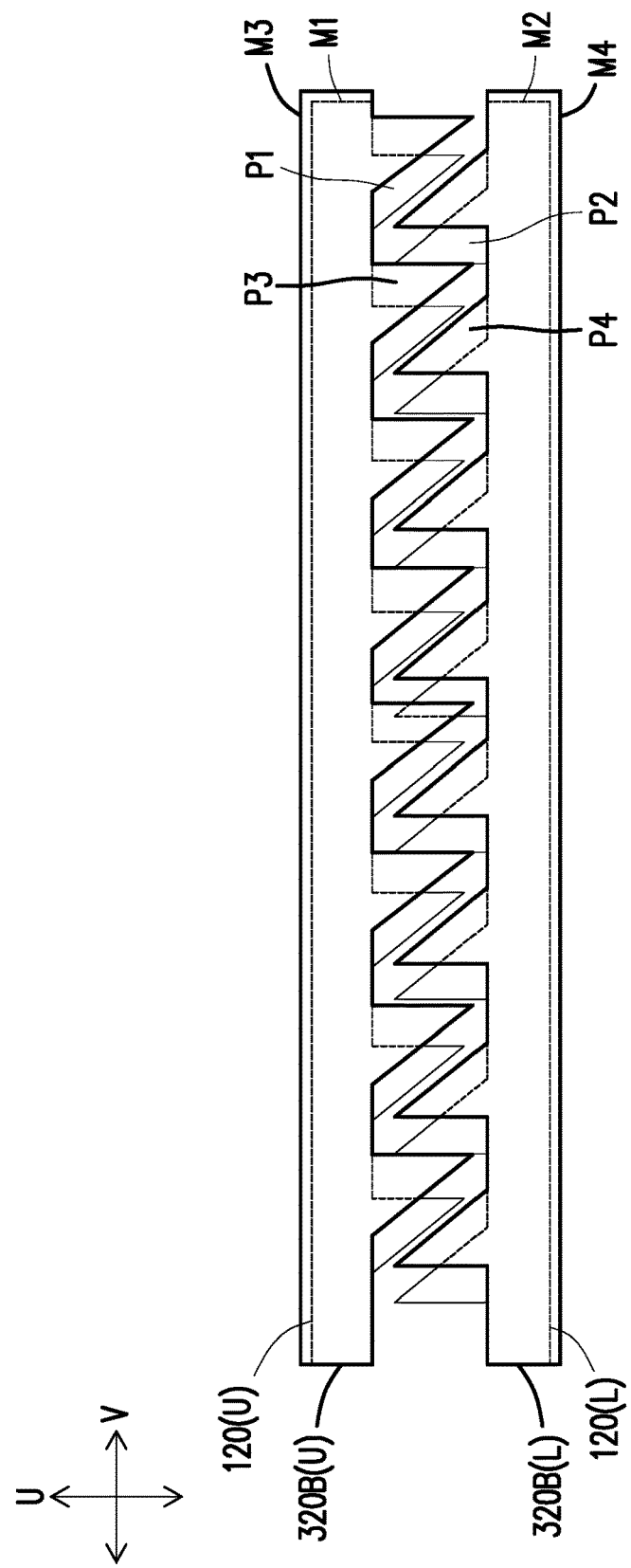
FIG. 5C is a schematic enlarged top views respectively illustrating relative positioning configurations between the metallization layer depicted in FIG. 5A and the connecting pads depicted in FIG. 5B in accordance with some exemplary embodiments of the present disclosure.
Figure 6B:
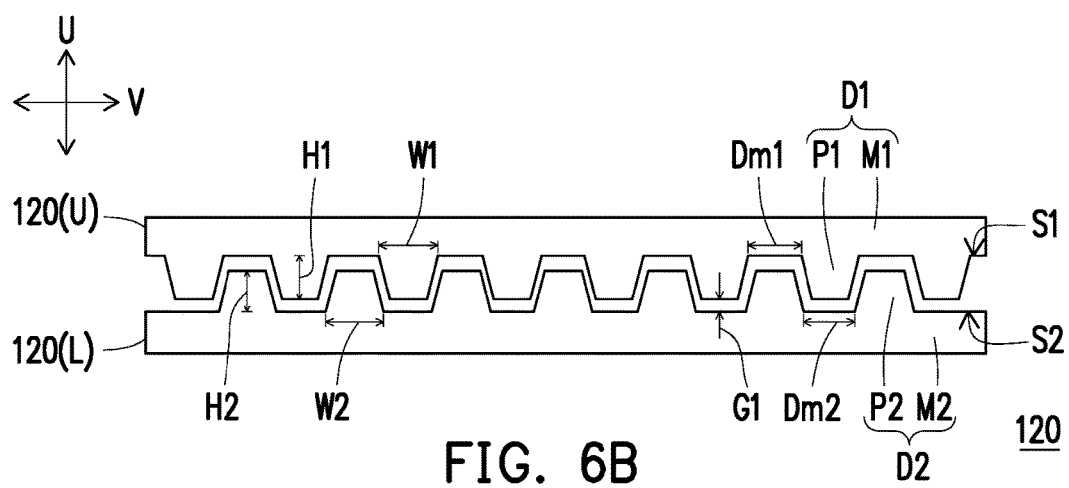
FIG. 6B is a schematic enlarged top view illustrating connecting pads of a semiconductor chip of the package structure of FIG. 2A indicating by a dotted box B1 in accordance with some exemplary embodiments of the present disclosure.
Figure 6C:
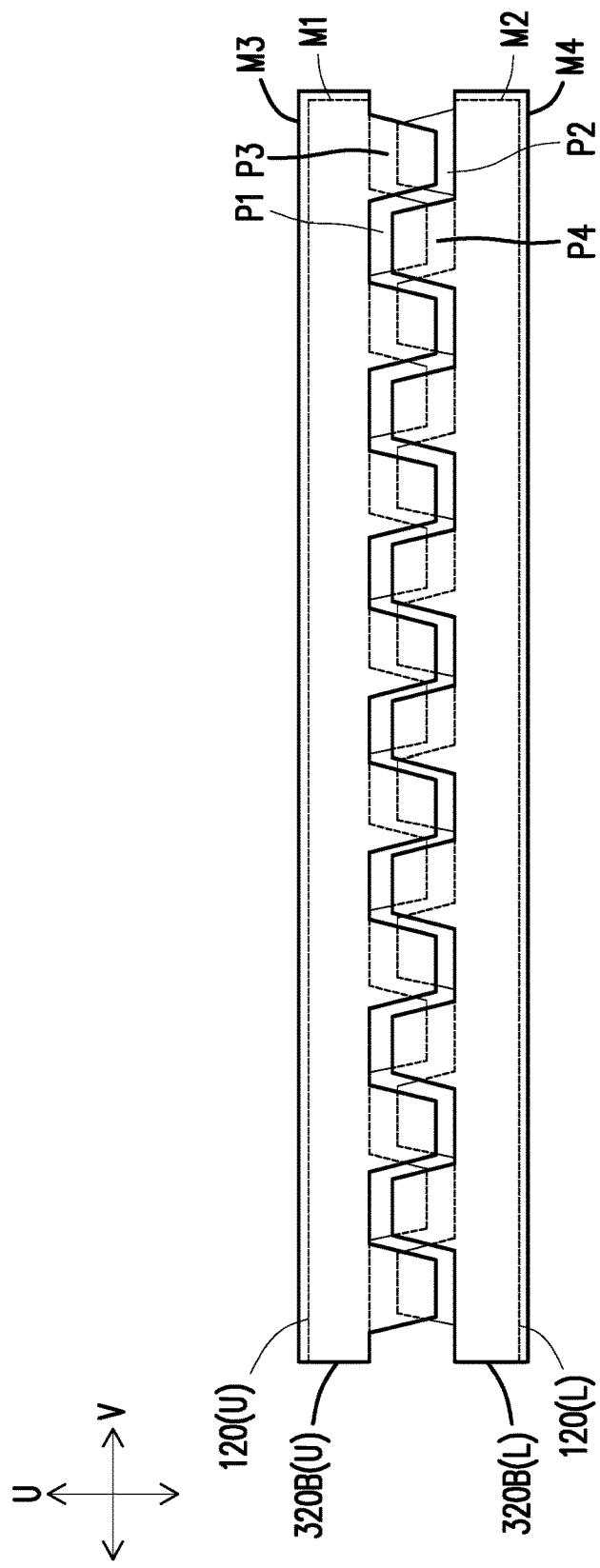
FIG. 6C is a schematic enlarged top views respectively illustrating relative positioning configurations between the metallization layer depicted in FIG. 6A and the connecting pads depicted in FIG. 6B in accordance with some exemplary embodiments of the present disclosure.
Figure 7B:
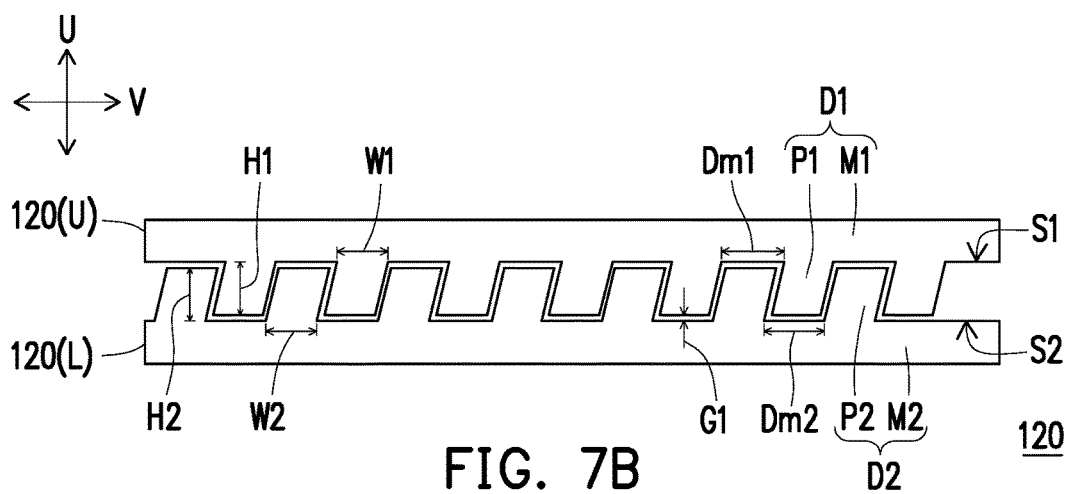
FIG. 7B is a schematic enlarged top view illustrating connecting pads of a semiconductor chip of the package structure of FIG. 2A indicating by a dotted box B1 in accordance with some exemplary embodiments of the present disclosure.
Figure 7C:
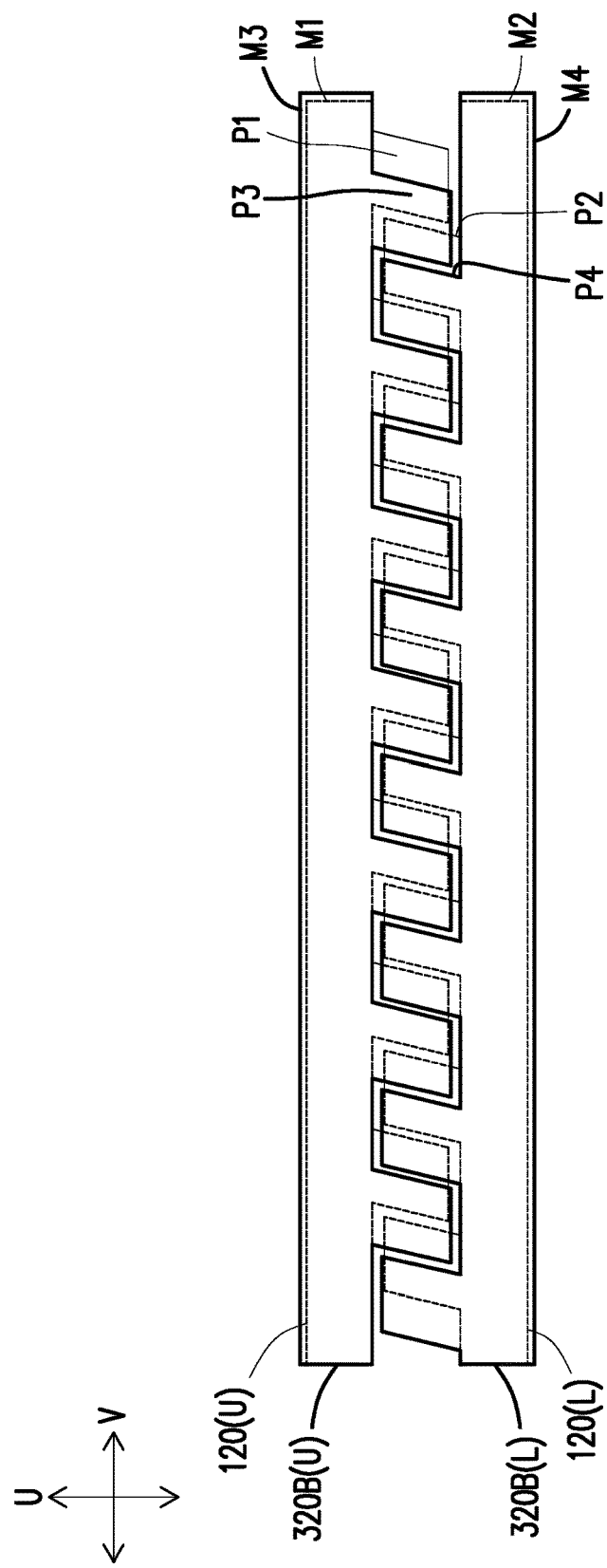
FIG. 7C is a schematic enlarged top views respectively illustrating relative positioning configurations between the metallization layer depicted in FIG. 7A and the connecting pads depicted in FIG. 7B in accordance with some exemplary embodiments of the present disclosure.

In certain embodiments, the shapes of the protrusions P1 and the protrusions P2 include a rectangle shape (FIG. 3B) or a square shape, where each of the protrusions P1 has a maximum size HI measured along the direction U and a maximum size W1 measured along the direction V, and each of the protrusions P2 has a maximum size H2 measured along the direction U and a maximum size W2 measured along the direction V. In certain embodiments, for the protrusions P1, the maximum size H1 is ranging from about 0.5 µm to about 20 µm, and the maximum size W1 is ranging from about 1 µm to about 50 µm. In certain embodiments, for the protrusions P2, the maximum size H2 is ranging from about 0.5 µm to about 20 µm, and the maximum size W2 is ranging from about 1 µm to about 50 µm. In one embodiment, the maximum size H1 and the maximum size H2 may be the same. In an alternative embodiment, the maximum size H1 may be different from the maximum size H2. In one embodiment, the maximum size WI and the maximum size W2 may be the same. In an alternative embodiment, the maximum size W1 may be different from the maximum size W2. The disclosure is not limited thereto. In alternative embodiments, with the above sizing specifications, the shapes of protrusions P1 and the protrusions P2 may include a triangle shape (FIG. 4B), a right triangle shape (FIG. 5B), a right trapezoid shape (FIG. 6B), a parallelogram shape (FIG. 7B), or combinations thereof, the disclosure is not limited thereto. Due to the protrusions P1 and the protrusion P2, the stress applied to the inter-layer dielectric layers 310 located near the two most adjacent the connecting pads (for example, the connecting pads 120(U) and 120(L)) is reduced, thereby achieving the durability of the package structure 10.

In an alternative embodiment, the shapes and dimensions of the protrusions P1, the protrusions P2, the protrusions P3, and the protrusions P4 may be the same. In one embodiment, the shapes and dimensions of the protrusions P1, the protrusions P2, the protrusions P3, and the protrusions P4 may be different, or may be partially different therein. The disclosure is not limited thereto. In some embodiments, the main portions M1, M2, M3, and M3 are referred as conductive strips.

In some embodiments, along the direction V, the main portion M1 of the connecting pad 120(U) is overlapped with the main portion M3 of the metal segment 320B(U) and the main portion M2 of the connecting pad 120(L) is overlapped with the main portion M4 of the metal segment 320B(L), where the protrusions P1 of the connecting pad 120(U) are partially overlapped with the protrusions P3 of the metal segment 320B(U) and the protrusions P4 of the metal segment 320B(L), and the protrusions P2 of the connecting pad 120(L) are partially overlapped with the protrusions P3 of the metal segment 320B(U) and the protrusions P4 of the metal segment 320B(L), also see FIG. 4C, FIG. 5C, FIG. 6C and FIG. 7C. In the embodiment of which the protrusions P1 and the protraction P2 are arranged in stagger manner (e.g. non-overlap) while the protrusions P1 and the protraction P2 are partially overlapped the protrusions P3 and/or the protraction P4, such that the gap G1 are not aligned with the gap G2 along the stacking direction Y shown in FIG. 2B. In other words, along the direction X perpendicular to the stacking direction Y, in a vertical projection on the active surface 110A of the semiconductor substrate 110, a projection location of the gap G1 between the connecting pad 120(U) and the connecting pad 120(L) is aside of a projection location of the gap G2 between the metal segment 320B(U) and the metal segment 320B(L). That is to say, the projection location of the gap G1 is partially overlapped with the projection location of the gap G2. In other words, portions of the gap G1 are exposed by the gap G2, see the top view depicted in FIG. 3C, FIG. 4C, FIG. 5C, FIG. 6C and FIG. 7C. Due to such configuration (e.g., the projection locations of the gap GI and the gap G2 in the vertical projection on the active surface 110A of the semiconductor substrate 110 are partially overlapped), the stress applied to the inter-layer dielectric layers 310 located between the connecting pads 120(U), 120(L) and the metal segments 320B(U), 320B (L) is further reduced, thereby achieving the durability of the package structure 10. In a further alternative embodiment, the projection location of the gap G1 may be completely not overlapped with the projection location of the gap G2 for further reducing the stress applied to the inter-layer dielectric layers 310 located between the connecting pads 120(U), 120(L) and the metal segments 320B(U), 320B (L).

However, the disclosure is not limited thereto. In an alternative embodiment, along the direction V, the main portion M1 of the connecting pad 120(U) is overlapped with the main portion M3 of the metal segment 320B(U) and the main portion M2 of the connecting pad 120(L) is overlapped with the main portion M4 of the metal segment 320B(L), where the protrusions P1 of the connecting pad 120(U) may be completely overlapped with one of the protrusions P3 of the metal segment 320B(U) and the protrusions P4 of the metal segment 320B(L) respectively, and the protrusions P2 of the connecting pad 120(L) may be completely overlapped with other one of the protrusions P3 of the metal segment 320B(U) and the protrusions P4 of the metal segment 320B(L) respectively.

However, the disclosure is not limited to above embodiments, in certain embodiments, a package structure 10 of the disclosure may only have the metal segments of the metallization layers of the redistribution circuit structure 300 with the non-planar edges (FIG. 3A, FIG. 4A, FIG. 5A, FIG. 6A, and FIG. 7A). In an alternative embodiment, a package structure 10 of the disclosure may only have the connecting pads 120 (included in the semiconductor chip 100) with the non-planar edges (FIG. 3B, FIG. 4B, FIG. 5B, FIG. 6B, and FIG. 7B).

In addition, throughout the disclosure, the direction Y is different from the direction X, the direction U, and the direction V; to be specific, the direction Y is substantially perpendicular to the direction X, the direction U, and the direction V for example, and the direction X is extended in the UV plane. It should be appreciated that the above embodiment(s) of the present disclosure provides applicable concepts that can be embodied in a wide variety of specific applications, as long as the specific applications involves two metal segments being extended in parallel with significantly long length (e.g. the length L as mentioned above). The embodiments are intended to provide further explanations but are not used to limit the scope of the present disclosure.

In accordance with some embodiments, a package structure includes at least one semiconductor chip, an insulating encapsulation, and a redistribution circuit structure. The at least one semiconductor chip has an active surface and connecting pads distributed thereon. The insulating encapsulation encapsulates the at least one semiconductor chip. The redistribution circuit structure is disposed on and has at least one metallization layer with metal segments, wherein the redistribution circuit structure is electrically connected to the at least one semiconductor chip through the at least one metallization layer and the connecting pads electrically connected thereto. A projection location of a first gap between any two most adjacent connecting pads of the connecting pads is partially overlapped with a projection location of a second gap between any two most adjacent metal segments of the metal segments of the at least one metallization layer in a vertical projection on the active surface of the at least one semiconductor chip.

In accordance with some embodiments, a package structure includes at least one semiconductor chip, an insulating encapsulation, and a redistribution circuit structure. The at least one semiconductor chip has an active surface and at least one metal layer distributed thereon, wherein the at least one metal layer includes a first division and a second division parallel to the first division. The first division has a first main portion and first protrusions protruding from a first side of the first main portion. The second division has a second main portion and second protrusions protruding from a second side of the second main portion, wherein the first side of the first division faces to the second side of the second division, and the first division is separated and spaced apart from the second division. The insulating encapsulation encapsulates the at least one semiconductor chip. The redistribution circuit structure is disposed on the at least one semiconductor chip and has at least one metallization layer, wherein the redistribution circuit structure is electrically connected to the at least one semiconductor chip through the at least one metal layer. The at least one metallization layer includes a third division and a fourth division parallel to the third division. The third division has a third main portion and third protrusions protruding from a third side of the third main portion. The fourth division has a fourth main portion and fourth protrusions protruding from a fourth side of the fourth main portion, wherein the third side of the third division faces to the fourth side of the fourth division, and the third division is separated and spaced apart from the fourth division.

In accordance with some embodiments, a package structure includes at least one semiconductor chip, an insulating encapsulation, and a redistribution circuit structure. The at least one semiconductor chip has an active surface and power terminals distributed thereon, wherein the power terminals at least includes a first conductive strip having first portions connected to a first side of the first conductive strip and a second conductive strip having second portions connected to a second side of the second conductive strip. The first side of the first conductive strip is separated and spaced apart from the second side of the second conductive strip by a first gap, and is parallel to the second conductive strip along an extending direction thereof. The first portions protrude toward the second side of the second conductive strip from the first side of the first conductive strip, the second portions protrude toward the first side of the first conductive strip from the second side of the second conductive strip, and the first portions and the second portions are located between the first conductive strip and the second conductive strip. The first portions are spaced apart from one another at the first side, and the second portions are spaced apart from one another at the second side. The insulating encapsulation encapsulates the at least one semiconductor chip. The redistribution circuit structure is disposed on the at least one semiconductor chip and has at least one metallization layer with metal segments, and the redistribution circuit structure is electrically connected to the at least one semiconductor chip through the at least one metallization layer and the power terminals. A projection location of the first gap between the first conductive strip and the second conductive strip is located aside of a projection location of a second gap between any two most adjacent metal segments of the metal segments of the at least one metallization layer in a vertical projection on the active surface of the at least one semiconductor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   at least one semiconductor chip, having an active surface and connecting pads distributed thereon;
   an insulating encapsulation, encapsulating the at least one semiconductor chip; and
   a redistribution circuit structure, disposed on the at least one semiconductor chip and having at least one metallization layer with metal segments, wherein the redistribution circuit structure is electrically connected to the at least one semiconductor chip through the at least one metallization layer and the connecting pads electrically connected thereto,
   wherein a projection location of a first gap between any two most adjacent connecting pads of the connecting pads is partially overlapped with a projection location of a second gap between any two most adjacent metal segments of the metal segments of the at least one metallization layer in a vertical projection on the active surface of the at least one semiconductor chip.

2. The package structure of claim 1, wherein the projection location of the first gap is completely staggered with the projection location of the second gap in the vertical projection on the active surface of the at least one semiconductor chip.

3. The package structure of claim 1, wherein each of the any two most adjacent connecting pads of the connecting pads comprises:
   a first main portion; and
   first protrusions, connected to a side of the first main portion, wherein any two adjacent first protrusions are separated from each other through a third gap.

4. The package structure of claim 3, wherein the third gap is ranging from about 1 µm to about 50 µm.

5. The package structure of claim 3, wherein the first protrusions of the any two most adjacent connecting pads of the connecting pads are located between the first main portion of the any two most adjacent connecting pads.

6. The package structure of claim 3, wherein a shape of the first protrusions comprises a rectangle shape, a triangle shape, a right triangle shape, a right trapezoid shape, a parallelogram shape, or combinations thereof.

7. The package structure of claim 1, wherein each of the any two most adjacent metal segments of the metal segments comprises:
   a second main portion; and
   second protrusions, connected to a side of the second main portion, wherein any two adjacent second protrusions are separated from each other through a fourth gap.

8. The package structure of claim 7, wherein the fourth gap is ranging from about 1 µm to about 50 µm.

9. The package structure of claim 7, wherein the second protrusions of the any two most adjacent metal segments of the metal segments are located between the second main portion of the any two most adjacent metal segments.

10. The package structure of claim 7, wherein a shape of the second protrusions comprises a rectangle shape, a triangle shape, a right triangle shape, a right trapezoid shape, a parallelogram shape, or combinations thereof.

11. A package structure, comprising:
    at least one semiconductor chip, having an active surface and at least one metal layer distributed thereon, wherein the at least one metal layer comprises:
        a first division, having a first main portion and first protrusions protruding from a first side of the first main portion; and
        a second division parallel to the first division, having a second main portion and second protrusions protruding from a second side of the second main portion, wherein the first side of the first division faces to the second side of the second division, and the first division is separated and spaced apart from the second division;
    an insulating encapsulation, encapsulating the at least one semiconductor chip; and
    a redistribution circuit structure, disposed on the at least one semiconductor chip and having at least one metallization layer, wherein the redistribution circuit structure is electrically connected to the at least one semiconductor chip through the at least one metal layer and the at least one metallization layer, wherein the at least one metallization layer comprises:
        a third division, having a third main portion and third protrusions protruding from a third side of the third main portion; and
        a fourth division parallel to the third division, having a fourth main portion and fourth protrusions protruding from a fourth side of the fourth main portion, wherein the third side of the third division faces to the fourth side of the fourth division, and the third division is separated and spaced apart from the fourth division.

12. The package structure of claim 11, wherein the third main portion is overlapped with the first main portion and the fourth main portion is overlapped with the second main portion along a stacking direction of the redistribution circuit structure and the at least one semiconductor chip.

13. The package structure of claim 11, wherein the first protrusions and the second protrusions are arranged in a stagger manner along an extending direction of the first division and the second division, and each of the third protrusions is partially overlapped with at least one of the first protrusions and the second protrusions.

14. The package structure of claim 11, wherein the third protrusions and the fourth protrusions are arranged in a stagger manner along an extending direction of the third division and the fourth division, and each of the fourth protrusions is partially overlapped with at least one of the first protrusions and the second protrusions.

15. The package structure of claim 11, wherein the first division is separated and spaced apart from the second division by a distance ranging from about 0.5 μm to about 20 μm.

16. The package structure of claim 11, wherein shapes of the first protrusions, the second protrusions, the third protrusions, and the fourth protrusions comprise a rectangle shape, a triangle shape, a right triangle shape, a right trapezoid shape, a parallelogram shape, or combinations thereof.

17. A package structure, comprising:
- at least one semiconductor chip, having an active surface and power terminals distributed thereon, wherein the power terminals comprise a first conductive strip having first portions connected to a first side of the first conductive strip and a second conductive strip having second portions connected to a second side of the second conductive strip,
  - wherein the first side of the first conductive strip is separated and spaced apart from the second side of the second conductive strip by a first gap, and the first conductive strip is parallel to the second conductive strip along an extending direction thereof,
  - wherein the first portions protrude toward the second side of the second conductive strip from the first side of the first conductive strip, the second portions protrude toward the first side of the first conductive strip from the second side of the second conductive strip, and the first portions and the second portions are located between the first conductive strip and the second conductive strip, wherein the first portions are spaced apart from one another at the first side, and the second portions are spaced apart from one another at the second side;
- an insulating encapsulation, encapsulating the at least one semiconductor chip; and
- a redistribution circuit structure, disposed on the at least one semiconductor chip and having at least one metallization layer with metal segments, and the redistribution circuit structure is electrically connected to the at least one semiconductor chip through the at least one metallization layer and the power terminals,
- wherein a projection location of the first gap between the first conductive strip and the second conductive strip is located aside of a projection location of a second gap between any two most adjacent metal segments of the metal segments of the at least one metallization layer in a vertical projection on the active surface of the at least one semiconductor chip.

18. The package structure of claim 17,
- wherein the any two most adjacent metal segments of the metal segments of the at least one metallization layer being separated and spaced apart by the second gap respectively comprise a third conductive strip having third portions connected to a third side of the third conductive strip and a fourth conductive strip having fourth portions connected to a fourth side of the fourth conductive strip,
- wherein the third conductive strip is parallel to the fourth conductive strip along an extending direction thereof,
- wherein the third portions protrude toward the fourth side of the fourth conductive strip from the third side of the third conductive strip, the fourth portions protrude toward the third side of the third conductive strip from the fourth side of the fourth conductive strip, and the third portions and the fourth portions are located between the third conductive strip and the fourth conductive strip, wherein the third portions are spaced apart from one another at the third side, and the fourth portions are spaced apart from one another at the fourth side.

19. The package structure of claim 18,
- wherein one of the first portions is partially overlapped with or completely staggered with a respective one of the third portions and the fourth portions, and
- wherein one of the second portions is partially overlapped with or completely staggered with a respective one of the third portions and the fourth portions.

20. The package structure of claim 18, wherein shapes of the first portions, the second portions, the third portions, and the fourth portions comprise a rectangular shape, a triangle shape, a right triangle shape, a right trapezoid shape, or a parallelogram shape.

* * * * *